(12) United States Patent
Koinuma et al.

(10) Patent No.: US 6,677,581 B1
(45) Date of Patent: Jan. 13, 2004

(54) HIGH ENERGY ELECTRON DIFFRACTION APPARATUS

(75) Inventors: Hideomi Koinuma, Yokohama (JP); Masashi Kawasaki, Yokohama (JP)

(73) Assignee: Japan Science and Technology Corporation, Kawaguchi (JP)

( * ) Notice: Subject to any disclaimer, the term of this patent is extended or adjusted under 35 U.S.C. 154(b) by 0 days.

(21) Appl. No.: 09/762,858

(22) PCT Filed: Sep. 10, 1999

(86) PCT No.: PCT/JP99/04949
§ 371 (c)(1),
(2), (4) Date: Feb. 14, 2001

(87) PCT Pub. No.: WO00/16372
PCT Pub. Date: Mar. 23, 2000

(30) Foreign Application Priority Data

Sep. 11, 1998 (JP) ............................................ 10-258971
Apr. 7, 1999 (JP) ............................................ 11-100134

(51) Int. Cl.[7] .................................................. H01J 49/04
(52) U.S. Cl. ...................................... 250/288; 250/306
(58) Field of Search .................................. 250/288, 306

(56) References Cited

U.S. PATENT DOCUMENTS 5,061,850 A * 10/1991 Kelly et al. .................. 250/306
5,675,148 A * 10/1997 Marui ......................... 250/306

FOREIGN PATENT DOCUMENTS

| JP | 44-29151 | 12/1969 |
|----|----------|---------|
| JP | 55-1062 | 1/1980 |
| JP | 57-16158 | 1/1982 |
| JP | 61-45550 | 3/1986 |
| JP | 63-50394 | 3/1988 |
| JP | 2-79348 | 3/1990 |
| JP | 2-250252 | 10/1990 |
| JP | 3-52946 | 5/1991 |
| JP | 5-217539 | 8/1993 |
| JP | 6-211597 | 8/1994 |

* cited by examiner

Primary Examiner—John R. Lee
Assistant Examiner—Phillip Johnston
(74) Attorney, Agent, or Firm—Westerman, Hattori, Daniels & Adrian, LLP (57) ABSTRACT

A high-energy electron diffraction apparatus in which its electron beam source includes a field emission type electron emitter and a final lens stop or diaphragm is disposed between an objective lens and a specimen. A region of environment of the electron beam that extends from the electron beam source to an objective lens stop or diaphragm is held to a high vacuum, and a region of environment of the electron beam that extends from the objective lens stop or diaphragm to the final lens stop or diaphragm is held to a medium vacuum. A beam axial alignment electrode assembly is disposed between the objective lens stop or diaphragm and the final lens stop or diaphragm. There are also disposed an astigmatic correction electrode assembly and a scan deflection electrode assembly between the final lens stop or diaphragm and the specimen. A screen is spaced away from the specimen at a distance of 50 mm or less.

11 Claims, 11 Drawing Sheets

HIGH ENERGY ELECTRON DIFFRACTION APPARATUS

BACKGROUND OF THE INVENTION

1. Field of the Invention

This invention relates to an apparatus for high-energy electron diffraction (HEED) analysis of reflection type.

2. Description of the Related Art

Among conventional techniques for electron diffraction there is known an analytical technique referred to as reflection type high-energy electron diffraction (abbreviated and hereinafter also referred to as "RHEED"), in which a beam of electrons is accelerated and focused for incidence at a small angle on the surface of a specimen and diffracted therein, and diffracted beams produced are reflected, forming an image.

Figure 14:
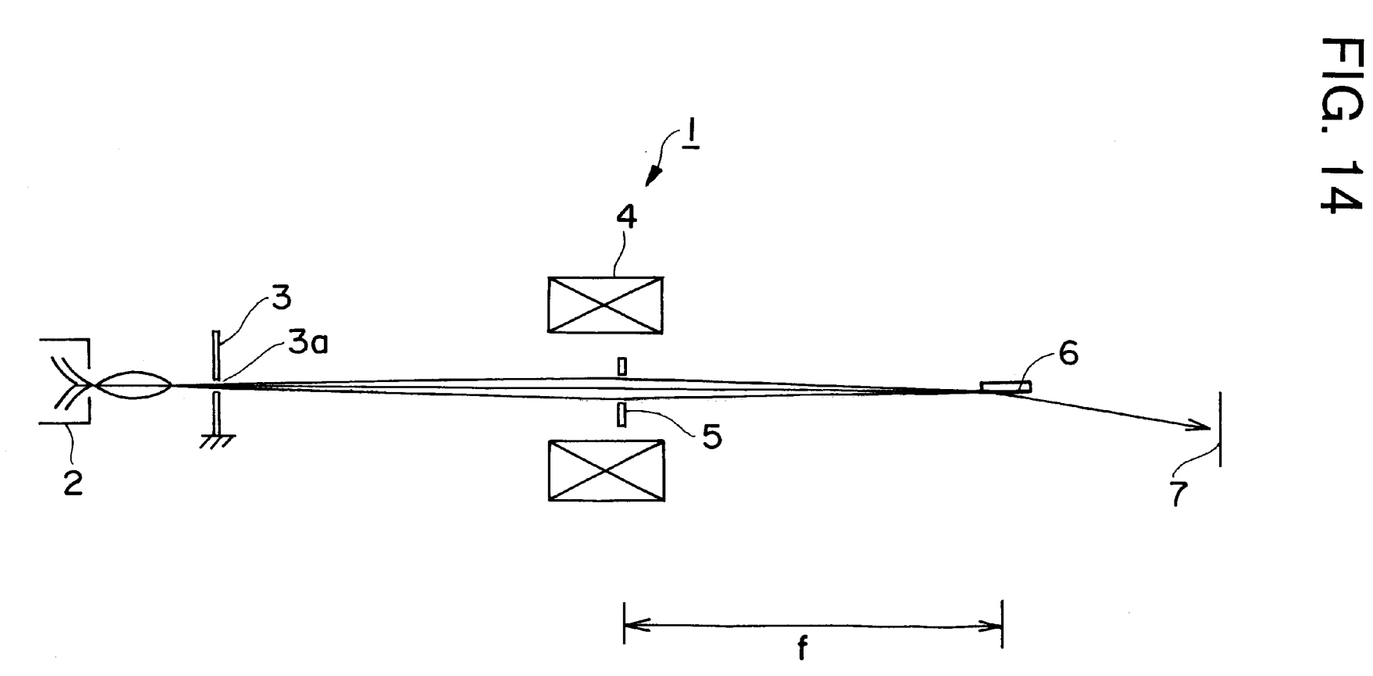
FIG. 14 is a diagrammatic view in elevation illustrating the typical construction of the conventional reflex type high-energy electron diffraction apparatus.

A system for RHEED in general has a makeup as illustrated in FIG. 14.

In the RHEED system 1 as shown in FIG. 14, a beam of electrons emitted from a source thereof 2 is directed towards an anode 3. The electron beam having passed through an opening 3a formed in the anode is accelerated and focused through an electronic objective lens 4 and objective diaphragm or lens stop 5 to impinge on a specimen 6 where beam diffraction produces diffracted electron beams which are reflected to impinge on a screen 7. The intensity of the diffracted beams is detected by a CCD (charge coupled device), not shown.

Using the RHEED system 1 in a low or reduced pressure process such as molecular beam epitaxy allows a film to grow, and its growth to be monitored, at an accuracy of one atomic layer, based on the fact that the mirror reflection intensity of the electron beams oscillates reflecting the irregularity of a surface on a level of one atomic layer.

By the way, for the source of electron beams 2 use has widely been made of an emitter of thermionic emission type which is readily usable at a pressure as low as $10^{-3}$ Pa or even lower. An electron beam having a diameter of 20 to 40 $\mu$m is thereby produced.

In such a case, if the electron beam is incident at an angle of 0.5 to 5 degrees on the specimen 6 and if the electronic objective lens 4 and the specimen 6 are spaced apart by a distance that is equal to a focal distance f as long as 105 mm or more, then the electron beam from the electron beam source 2 focused on the specimen 6 by the electronic objective lens 4 cannot be reduced in minimum diameter to less than 100 $\mu$m.

Thus, if the electron beam is incident at, for example, 3 degrees, on the specimen 6 it will have a cross section projected on a surface of the specimen whose diameter in its longitudinal direction is as large as about 2 mm. This means it is not possible, and this has indeed made it impossible, to monitor and identify on the specimen 6 a varying thin film structure as small as 2 mm×100 $\mu$m or less.

It should be noted that this existing failure in the RHEED lies where on the other hand the state of art has the recent years seen a variety of in-vacuum film forming apparatus proposed, based on a so-called combinatorial technique that makes it possible to form on a given specimen very thin films adjacent to each other, called pixels, which vary in film forming conditions, simultaneously in a single process step. The pixels lying adjacent to each other commonly have a size of at most 100 $\mu$m ×100 $\mu$m and typically less, which it is desirable to monitor and identify.

Further, while in the conventional applications of the RHEED the position of a spot on the specimen irradiated with the electron beam can be located enough on visual observation, this does not apply to the combinatorial synthesis used to prepare a plurality of thin films parallel to one another. Then, the need arises to adjust the position of irradiation with the electron beam, accurately in the order of the size, e.g., 100 $\mu$m×100 $\mu$m, of each of the pixels lying adjacent to each other so that the irradiating beam may be positioned precisely pixel by pixel.

Therefore, in order for pixels to be monitored and identified each individually with precision under their given respective irradiating conditions, a need arises to form a beam of electrons having an area of irradiation that is at most equal to the size of a pixel or less.

Figure 15:
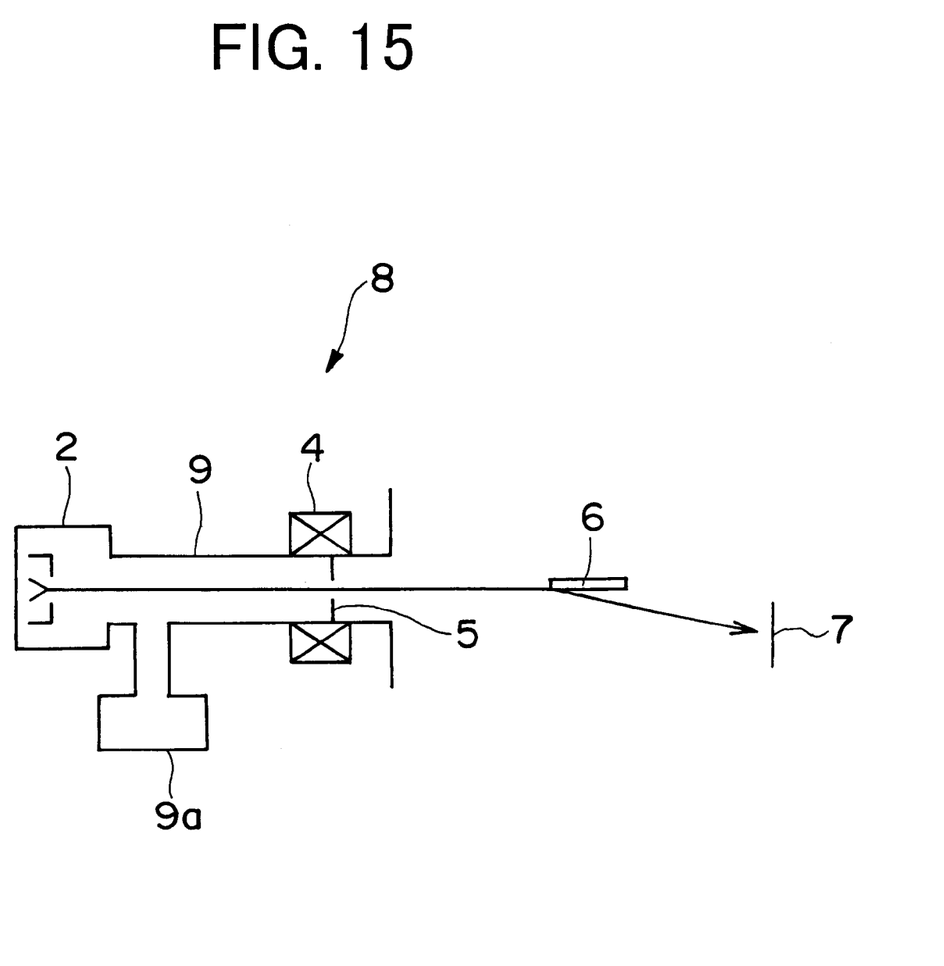
FIG. 15 is a diagrammatic view in elevation illustrating another exemplary construction of the conventional reflex type high-energy electron diffraction apparatus.

Mention may further be made of the fact that a RHEED system is also known provided with what is called a differential evacuation structure as shown in FIG. 15.

Such a RHEED system as illustrated in FIG. 15 differs from that shown in FIG. 14 in that a region of the system extending from the electron beam source 2 over to the electronic objective lens 4 and objective diaphragm or lens stop 5 is disposed in a low pressure chamber 9 and an area of the electron beam source 2 is reduced in pressure by a pump 9a and held at a pressure of $10^{-3}$ Pa or less.

By reason of the limitation imposed by the structure with a single pressure stage of the objective diaphragm or lens stop 5 to make a maximum differential pressure ratio attainable at most about 1/1000, holding the region of the electron beam source 2 under a pressure of $10^{-3}$ Pa or less has required the region of the specimen 6 to be placed under a pressure of several Pa or less.

Such structured RHEED system 8, as does the RHEED system 1 of FIG. 14, makes it impossible to monitor and identify on the specimen 6 varying thin film structures as small as 2 mm×100 $\mu$m in size.

It is accordingly an object of the present invention to provide a high-energy electron diffraction analysis apparatus that is capable of monitoring and identifying varying thin film structures of 100 $\mu$m×100 $\mu$m or less in size synthesized parallel to one another on a specimen.

SUMMARY OF THE INVENTION

In order to achieve the objects mentioned above, the present invention provides a high-energy electron beam diffraction analysis apparatus in which a specimen is securely held in a vacuum chamber capable of evacuation to a high vacuum and is irradiated with a high-energy beam of electrons to form an image of reflected beam diffraction, which apparatus comprises: a first casing adapted to accommodate therein an electron beam source for producing an electron beam, the first casing having a first aperture; and a second casing coupled to the said first casing via the said first aperture and having an end portion formed with a second aperture coaxial with the said first aperture, wherein the first and second casings form a differential evacuation structure with the said first casing held at a lower pressure than the said second casing, and the electron beam source accommodated in the first casing comprises a field emission type electron emitter.

This construction that makes up the region from the electron beam source constituted with a field emission type electron emitter to the specimen in a two-stage differential evacuator structure allows the first casing to be held under a low pressure of $10^{-6}$ Pa or less ideally suited for the field emission type electron emitter and yet a region of the specimen to be held under a comparatively high pressure of several tens Pa. Thus, should the first casing be evacuated to a high vacuum as low as $10^{-6}$ Pa or less which the use of a field emission type electron emitter as the electron beam source requires, creating a difference in pressure in two stages allows not only the first casing to be readily so evacuated but a region of the specimen to be yet left high in pressure for the ease of handling specimens.

The field emission type electron emitter is advantageous in that it emits an electron beam as fine as several hundreds angstroms or less in diameter which is left as still fine as 0.5 $\mu$m or less in diameter when incident on a specimen placed at a long focal distance of 150 mm or more.

A high-energy electron diffraction apparatus according to the present invention as set forth preferably provides the said first casing in a region of the said first aperture with an electronic objective lens and objective diaphragm or lens stop for focusing the electron beam from the said source on a specimen, and the said second casing at the said second aperture with a final diaphragm or lens stop.

This construction coupled to the use of a field emission type electron emitter permits the electron beam incident on a specimen to remain as thin as 0.5 $\mu$m or less even if the specimen is spaced from the electronic lens at a distance of 150 mm to 300 mm.

Thus, if the electron beam is incident on the specimen at an angle of incidence of, e.g., 3 degrees, its size projected on the specimen being in the order of 100 $\mu$m×0.5 $\mu$m will be sufficient to identify a thin film structure of 100 $\mu$m×100 $\mu$m or less in size such as a pixel of 100 $\mu$m×100 $\mu$m or less in size in the so-called combinatorial process.

Also, a high-energy electron diffraction apparatus according to the present invention as set forth preferably includes an axial alignment means disposed between the objective diaphragm or lens stop disposed in the region of the said first aperture in the said first casing and the final diaphragm or lens stop disposed at the said second aperture in the said second casing for adjusting an axial alignment of the electron beam passed through the said objective diaphragm or lens stop.

This construction in which the axial alignment means that may be constituted with axial alignment electrodes or electromagnetic coils allows an electron beam passed through the objective diaphragm or lens stop to be axially aligned and brought into alignment with an axis to a specimen, permits the electron beam to precisely be incident on the specimen.

Further, high-energy electron diffraction apparatus according to the present invention preferably includes, disposed between the said final diaphragm or lens stop disposed at the said second aperture and the said specimen, at least one of an astigmatic correction means for correcting a projected image of the electron beam incident on the said specimen and a scan deflection means for adjustably positioning the electron beam relative to an area on the specimen that is irradiated therewith.

According to this construction, providing for the astigmatic correction means constituted, e.g., by astigmatic correction electrodes causes the electrodes to make the pencil of the electron beam incident obliquely onto a specimen narrower in cross section, thereby making its projected image circular. This permits an electron beam that may if not so corrected be projected to have a size of 100 $\mu$m×0.5 $\mu$m to be converted into a circular projected image of about 20 $\mu$m in diameter, thereby permitting a thin film structure on the specimen to be identified with an equal resolution both lengthwise and breadthwise.

Also, providing for the scan deflection means constituted, e.g., by scan deflection electrodes causes the electrodes to deflect the center of the incident electron beam and to effect its scanning based on a scanning signal. This permits a detector that may be used to detect the impingement of the electron beam on a screen while scanning on the screen to scan in synchronous with a scan-deflecting signal for the scan deflection electrodes, thus to permit observing a magnified image that is composed of a plurality of pixels on the screen, and to make it possible to adjust the position of irradiation with the electron beam with an increased reliability.

Also, a high-energy electron diffraction apparatus according to the present invention preferably includes the said astigmatic correction means and the said scan deflection means as disposed alternately, symmetrically about an axis of the electron beam.

This construction permits scanning an electron beam while rectifying its beam diameter.

Yet further, a high-energy electron diffraction apparatus according to the present invention as set forth preferably includes the said astigmatic correction means and the said scan deflection means as constructed so as to be interchangeable on changing polarity.

According to this construction, simply changing the polarity of a voltage that controls driving the astigmatic correction means and the scan deflection means easily alters their operations.

Also, a high-energy electron diffraction apparatus according to the present invention as set forth preferably uses as or in each of the said astigmatic correction means and the said scan deflecting means a plurality of pairs of electrodes or electromagnetic coils.

This construction, which permits creating an electromagnetic force at a site at which an element of the astigmatic correction means and the scan deflection means, is provided to control the beam diameter of an electron beam and the direction of its scanning.

Still further, a high-energy electron diffraction apparatus according to the present invention preferably uses in the said scan deflection means a first and a second deflecting electromagnetic coil means for permitting the electron beam to be incident on the specimen at any given angle of incidence as desired.

This construction permits a specimen and a selected area thereof to be scanned with an incoming electron beam moving parallel and incident at a given angle adjustable in a wide range, and thus allows, for example, a rocking curve to be promptly obtained.

Also, a high-energy electron diffraction apparatus according to the present invention as set forth preferably includes a screen for projecting thereon the diffracted electron beams from said specimen, disposed at a position spaced apart from the specimen at a distance not greater than 50.

This construction permits electrons reflected by a specimen if a region thereof is placed under a relatively high pressure in the order of several tens Pa to reach the screen without much experiencing collision with and scattering by intervening gaseous molecules, and thus allows the electrons reflected by the specimen to be detected with precision.

Further, a high-energy electron diffraction apparatus according to the present invention as set forth preferably uses as a screen for projecting thereon the diffracted electron beams from said specimen, a porous screen with an electron multiplying function.

This construction permits a weak diffraction signal caused by a small number of electrons reflected to yet yield detecting those electrons from the screen without fail.

BRIEF DESCRIPTION OF THE DRAWINGS

The present invention will better be understood from the following detailed description and the drawings attached hereto showing certain illustrative forms of embodiment of the present invention. In this connection, it should be noted that such forms of embodiment illustrated in the accompanying drawings hereof are intended in no way to limit the present invention but to facilitate an explanation and understanding thereof.

In the drawings:

FIG. 5A is a diagrammatic view illustrating how an electron beam is incident on a specimen, and FIG. 5B is a diagrammatic view illustrating an projected image of the electron beam incident on the specimen, both in the absence of the astigmatic correction electrode assembly;

DETAILED DESCRIPTION OF THE PREFERRED EMBODIMENTS

A detailed description will first be given of a first embodiment of an apparatus for reflex type high-energy electron diffraction system (hereinafter also referred to as "RHEED") according to the present invention.

Figure 1:
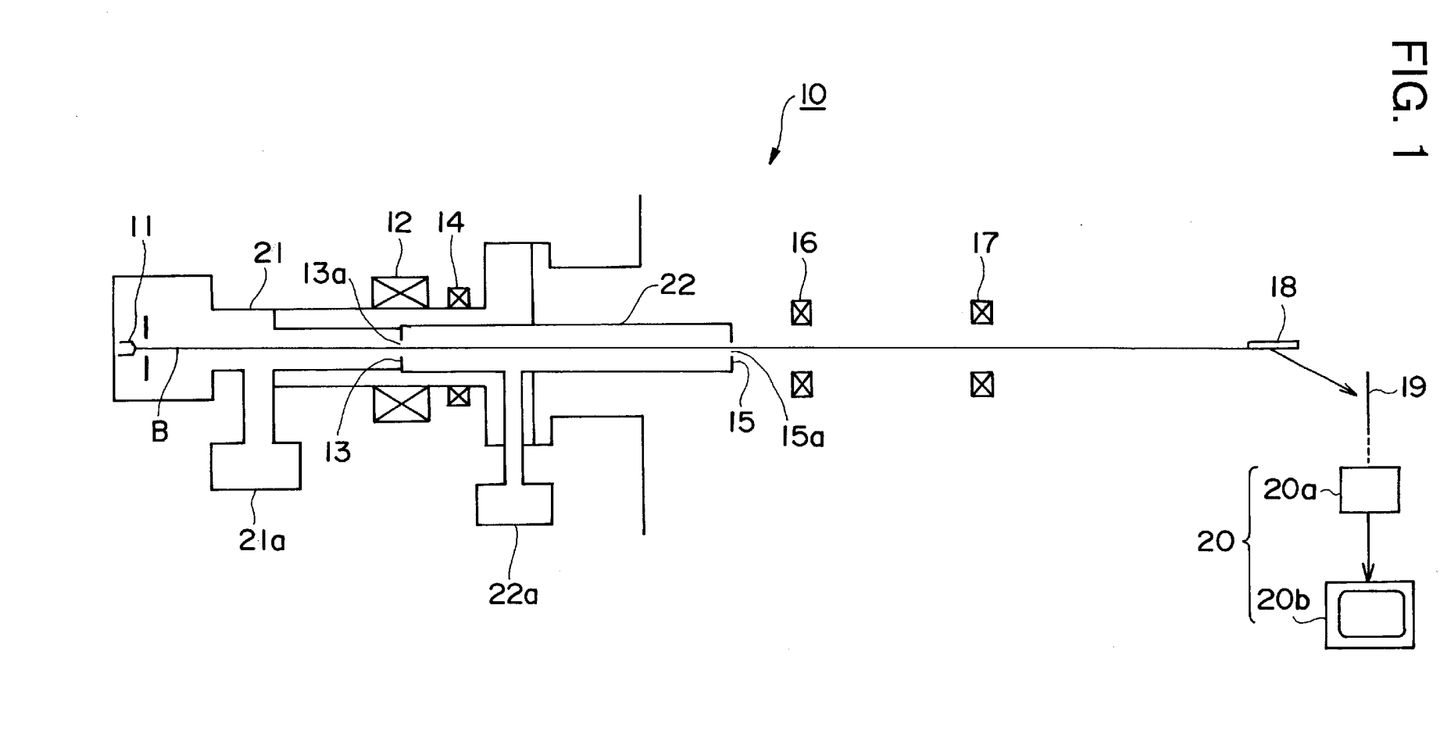
FIG. 1 is a diagrammatic side view illustrating the construction of a high-energy electron diffraction apparatus that represents a first form of embodiment of the present invention.

FIG. 1 shows a first form of embodiment of the RHEED according to the present invention.

Referring to FIG. 1, a RHEED 10 includes an electron beam source 11 for emitting an electron beam B and, arranged in series along an axial path of the electron beam B emitted, an electronic objective lens 12 and objective diaphragm or lens stop 13, an axial alignment means' electrode assembly 14, a final diaphragm or lens stop 15, an astigmatic correction means' electrode assembly 16, and a scan deflection means' electrode assembly 17 ahead of a specimen 18. Also included in the RHEED 10 are a screen 19, and a detector means 20 for detecting electrons impinging on the screen 9. The RHEED 10 further includes a first casing 21 that has the electron beam source 11 and the objective lens stop or diaphragm 13 and that hermetically encloses therein the environment of a portion of the path of the electron beam extending from the electron beam source 11 to the electronic objective lens stop or diaphragm 13, and a second casing 22 that has the final lens stop or diaphragm 15 and that hermetically encloses therein the environment of a portion of the path of the electron beam extending from the lens stop or diaphragm 13 to the final lens stop or diaphragm 15.

Figure 2:
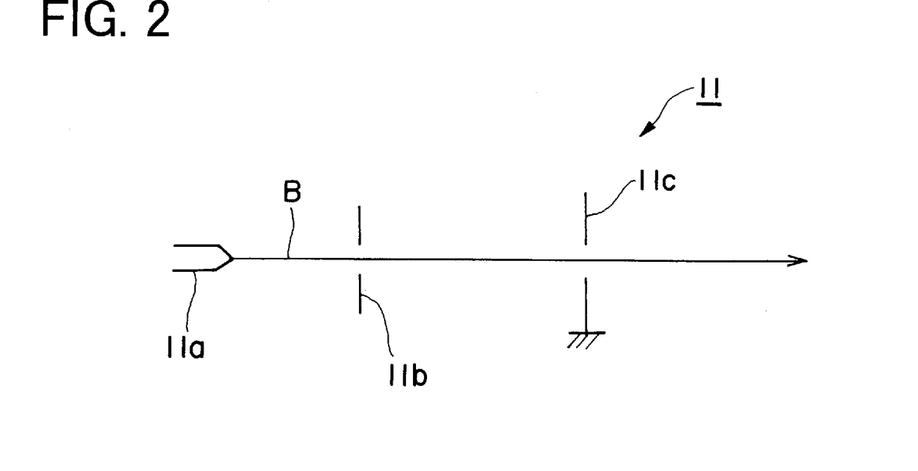
FIG. 2 is a partial side view illustrating an exemplary construction of the electron beam source for use in the high-energy electron diffraction apparatus shown in FIG. 1.

The electron beam source 11 as shown in FIG. 2 is a field emission type, including an electron emitter 11a, pull-out electrode 11b and an anode 11c.

The electron emitter 11a is constructed, e.g., with a driving voltage of −20 kV to −30 kV applied thereto to emit an electron beam B having a diameter of several tens nm or less.

The pull-out electrode 11b is a disk-shaped electrode disposed at a right angle to the axis and having an opening in its central area for passage by the electron beam, and is designed, e.g., with a voltage of 0 to +3 kV applied thereto to pull out the electron beam B emitted from the emitter 11a, denser in its axial direction.

The anode 11c is likewise a disk-shaped electrode disposed at a right angle to the axis and having an opening in its central area for passage by the electron beam B to advance further in its axial direction.

As shown in FIG. 1, the electronic objective lens 12 is designed to act as a convex lens for the electron beam B, thereby to focus it towards the specimen 18.

Also as shown in FIG. 1, the electronic objective lens stop or diaphragm 13 has on its axis an aperture 13a through which to stop down or squeeze the electron beam B and thereby to make thinner in diameter the electron beam B incident on the specimen 18.

Figure 3:
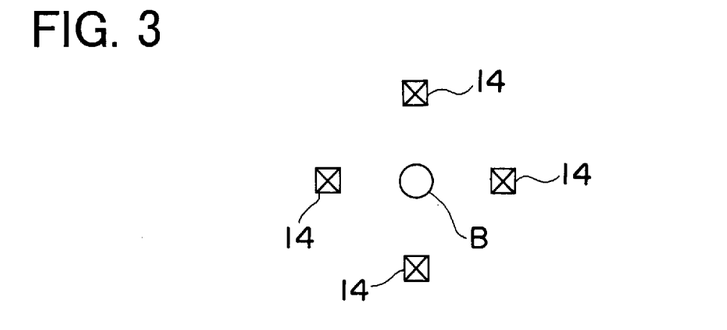
FIG. 3 is a diagrammatic cross sectional view in elevation illustrating an exemplary construction of an axial alignment electrode assembly for use in the high-energy electron diffraction apparatus shown in FIG. 1.

It is further seen that the axial alignment means' electrode assembly 14 is made up, as shown in FIG. 3, of two pairs of electrodes disposed crossways with the two electrodes in each pair lying symmetrically with each other about the axis.

The axial alignment means 14 may alternatively be made up of two pairs of electromagnetic coils disposed crossways with the two electromagnetic coils in each pair lying symmetrically with each other about the axis.

These two pair of electrodes or electromagnetic coils are designed to act electromagnetically on the electron beam B which passes through them, to thereby render the electron beam B aligned with the axis of the system. It should be noted that the axial alignment electrode assembly 14 is not always necessary but can be omitted.

Also as shown in FIG. 1, the final lens stop or diaphragm 15 has on its axis an aperture 15a through which to further stop down or further squeeze the electron beam B and thereby to further reduce the diameter of the electron beam B to be eventually incident on the specimen 18, for example, to 0.5 $\mu$m or less.

Figure 4:
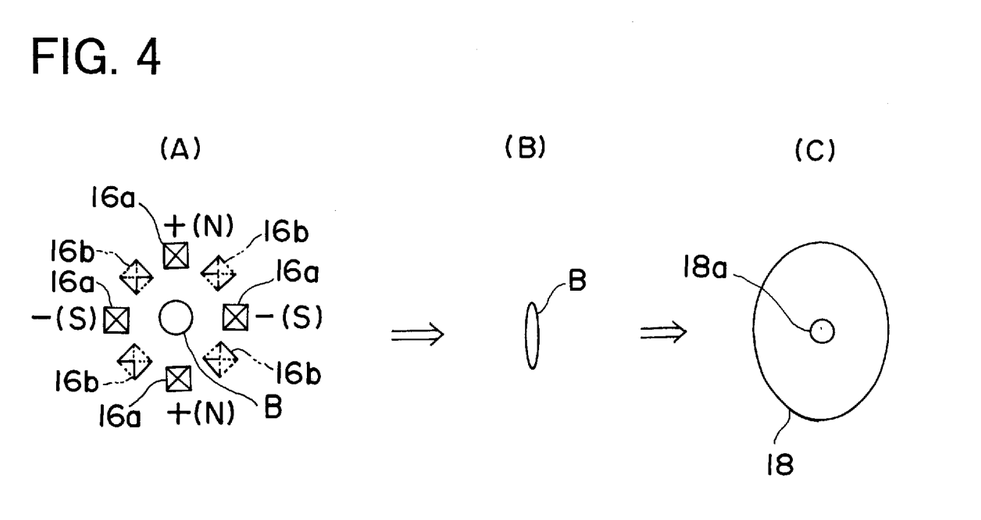
FIG. 4A is a diagrammatic cross sectional view in elevation illustrating an exemplary construction of an astigmatic correction electrode assembly for use in the high-energy electron diffraction apparatus shown in FIG. 1.
FIG. 4B is a diagrammatic view illustrating a cross sectional configuration of an electron beam deformed by the astigmatic correction electrode assembly.
FIG. 4C is a diagrammatic view illustrating a projected image of the electron beam incident on a specimen.

The astigmatic correction electrode assembly 16 as one of the astigmatic correction means designed to make even in size the diameter of an electron beam on a specimen may, as shown in FIG. 4A, be made up of a first group of two pairs of electrodes 16a disposed crossways with the two electrodes of each pair lying symmetrically with each other about the axis and with the two electrodes of one pair having the same one polarity and those of the other pair having the same opposite polarity, and preferably further by a second group of two pairs of electrodes 16b poled likewise and disposed crossways but with each of the electrodes in the second group interposed between two adjacent electrodes in the first group. It should be noted that here again these electrodes may be replaced by corresponding electromagnetic coils suitably poled with N and S poles, e.g., as indicated by letters N and S in FIG. 4A.

With the astigmatic correction electrode assembly 16 thus provided, applying a driving voltage to each of the electrodes 16a and 16b will act to reduce the diameter of the electron beam B in the direction of its incidence on the specimen 18, e.g., as shown in FIG. 4B.

This permits the electron beam B as astigmatically corrected by the astigmatic correction electrode assembly 16 to form, when obliquely incident and then projected on the specimen 18, a circular image of projection 18a that is rectified as shown in FIG. 4C.

Figure 5:
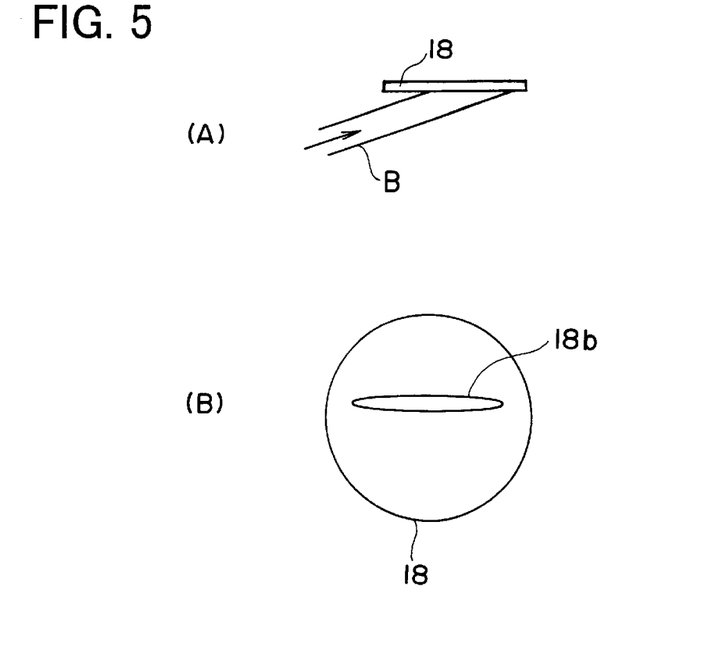

In the absence of the astigmatic correction electrode assembly 16, the electron beam B obliquely incident on the specimen 18 as shown in FIG. 5A will have a flat, elliptical image of projection that is elongate in its direction of incidence as indicated at 18 in FIG. 5B. It should be noted that the astigmatic correction electrode assembly 16 is not mandatory, however, and may be dispensed with.

The scan deflection electrode assembly 17 as a scan deflection means designed to irradiate a specimen with a scan-controlled electron beam is also shown in FIG. 1, as disposed between the astigmatic correction electrode assembly 16 and the specimen 18. The scan deflection electrode assembly 17 as shown in FIG. 6A is made up of two pairs of electrodes disposed crossways across the axis of the electron beam, i. e., a first pair of electrodes 17a of different polarities disposed lengthwise and a second pair of electrodes 17b of different polarities disposed breadthwise.

Figure 6:
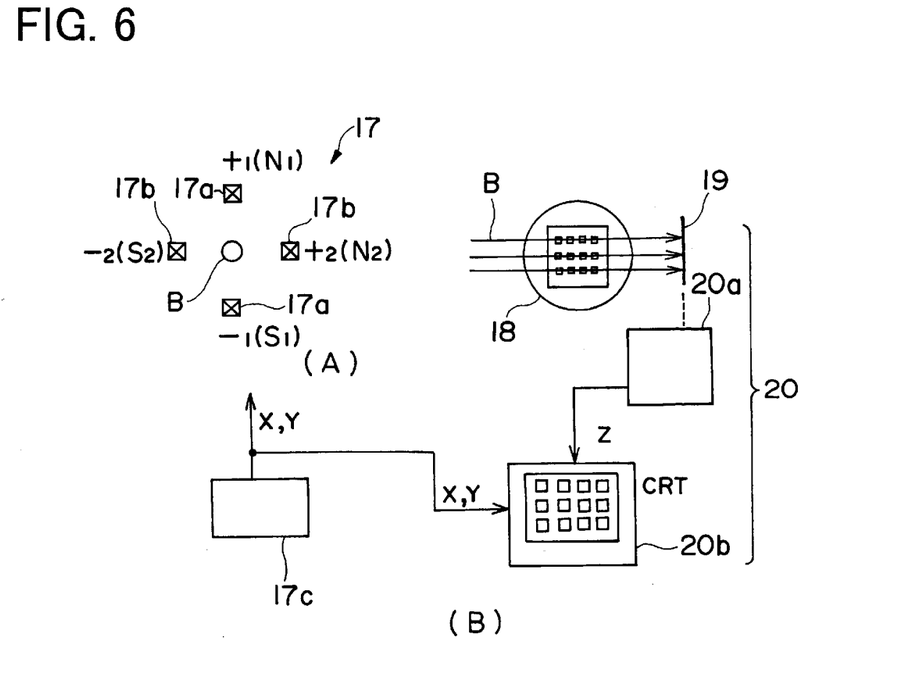
FIG. 6A is a diagrammatic cross sectional view in elevation illustrating a exemplary construction of a scan deflection electrode assembly for use in the high-energy electron diffraction apparatus shown in FIG. 1.
FIG. 6B is a diagrammatic view illustrating a detector assembly in relation to the scan deflection electrode assembly.

As shown in FIG. 6B, these pairs of electrodes 17a and 17b are designed to be driven under control by a drive control means 17c to deflect the traversing electron beam in a longitudinal direction (direction of y-axis) while scan-deflecting it in a transverse direction (direction of x-axis). The drive control 17c is also designed to control driving of an imaging means to be mentioned later for the detector means 20 synchronously with driving of the electrodes 17a and 17b.

In the scan deflection means as well, it should be noted that the electrodes may be replaced by electromagnetic coils poled suitably, e.g., as indicated by characters N1, N2, S1 and S2. It should further be noted that the span deflection means or electrode assembly 17 is not always necessary and may be dispensed with.

The specimens 18 is advantageously a specimen on which a thin film structure is to be detected. It may be provided with a plurality of pixels arranged parallel to one another, each having a size of 100 $\mu$m×100 $\mu$m or less, which are formed by the so-called combinatorial process. The specimen 18 is disposed on the axis of the system for the electron beam B from the electron beam source 11 so that the electron beam B from the electron beam source 11 may be incident on the specimen 18 at a small angle, e.g., 0.5 to 5 degrees.

Figure 7:
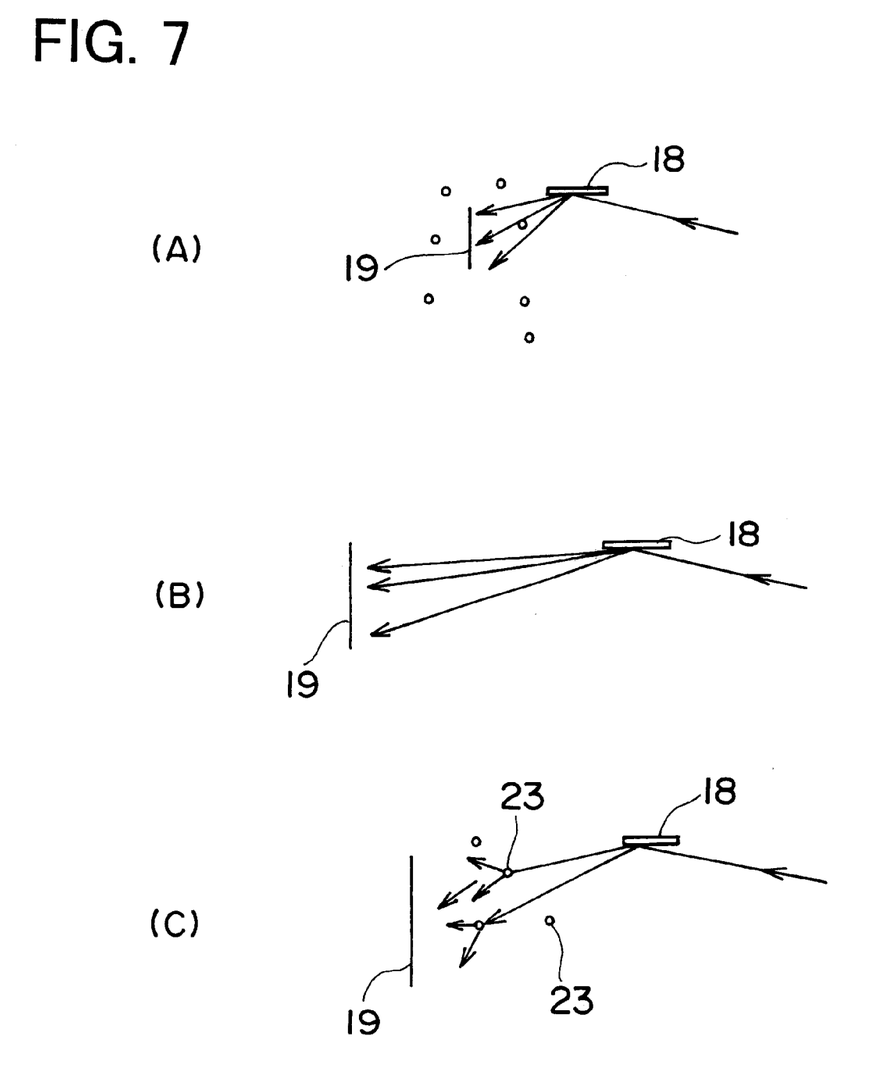
FIG. 7A is a diagrammatic side view illustrating an electron beam reflected by a specimen as in the high-energy electron diffraction apparatus shown in FIG. 1.
FIG. 7B is a similar view illustrating an electron beam reflected by a specimen placed under a low pressure in the conventional high-energy electron diffraction apparatus.
FIG. 7C is a similar view illustrating an electron beam reflected by a specimen simply placed under a high pressure.

The screen 19 as shown in FIG. 7A is disposed at nearly a right angle to the system axis for the electron beam so that it may have reflected electron beams from the specimen 18 impinging thereon. The screen is also spaced from the specimen 18 at a short distance of, e.g., 50 mm or less. This arrangement ensures that the reflected electron beams from the specimen 18 if its region is placed under a pressure as high as several tens Pa yet reach enough and impinge on the screen 19.

It should be noted that with the screen 19 spaced from the specimen 18 by a long distance, the reflected electron beams can well reach the screen 19 from the specimen 18 if its region's pressure is as low as $10^{-6}$ Pa, but if the region of the specimen 18 is placed under a pressure as high as several tens Pa, at least most of them would scatter on colliding with gaseous molecules 23 on the way to the screen 19 and would thus be unable to reach it.

The detector means 20 is made up of an imaging means 20a that may comprise, e.g., a CCD (charge coupled device), which makes an image on the screen 19 of a diffraction pattern of the pixels on the specimen 18 scanned with the electron beam deflected, and a display means 20b that may comprise, e.g., a CRT, which displays the image made by the imaging means 20a.

Here, the imaging means 20a as mentioned before is adapted to be controllably driven in synchronous with a scanning signal from the drive control means for the scan deflection electrode assembly 17. This permits the image made by the imaging means 20a to be formed as a magnified image made of the pixels scanned at a plurality of positions.

The first casing 21 as shown in FIG. 1 is made up so as to hermetically enclose a region of the environment of the electron beam that extends from the electron beam source 11 to the objective diaphragm or lens stop 13 and further has the aperture 13a of the diaphragm or lens stop 13 as an orifice. This casing has its interior pressure maintained by a pump 21 a at a low pressure of, e.g., $10^{-7}$ Pa or less.

The second casing 22 as shown in FIG. 1 is made up so as to hermetically enclose a region of the environment of the electron beam that extends from the objective diaphragm or lens stop 13 to the final lens stop or a diaphragm 15 and further has the aperture 15a of the lens stop or diaphragm 15 as an orifice. This casing has its interior pressure maintained by a pump 22a at a medium pressure of, e.g., $10^{-3}$ Pa or less. In contrast, a region of environment of the electron beam that extends from the final diaphragm 15 to the specimen 18 and further to the screen 19 is held by means not shown to a high pressure as high as, e.g., several tens Pa.

An explanation is next given in respect of operations of the RHEED 10 so constructed as described above according to the first embodiment of the present invention.

An electron beam B emitted from the electron beam source 11 and having a beam diameter of 0.5 μm or less is focused by the electronic objective lens 12, is squeezed or reduced in diameter through the objective lens stop or diaphragm 13, and is then axially straightened out by the axial alignment electrode assembly 14. Thereafter, it is again squeezed or reduced in diameter through the final diaphragm or lens stop 15.

Next, the electron beam B is deformed in its cross sectional configuration by the astigmatic correction electrode assembly 16, and then after it is scan-deflected with the scan deflection electrode assembly 17, is incident at a small angle on a specimen 18. The electron beam with its cross sectional configuration deformed by the astigmatic correction electrode assembly 15 will then have its projected image circular on the specimen 18.

Then, the electron beam is reflected by the specimen into reflected electron beams which are allowed to impinge the screen 19. An image for the electrons impinging the screen 19 is made by the imaging means 20a of the detector means 20 for display on the display means 20b.

In this case, designing the electron beam source 11 to include a field emission type electron emitter which permits an electron beam to be emitted with a beam diameter if 0.5 μm or less allows the electron beam to be projected with a circular image having a diameter of 20 μm or less on the specimen 18. It is seen therefore that this is sufficient to detect a thin film structure of a size of 20 μm×20 μm or so. To mention further, accommodating the field emission type electron emitter in the first casing 21 maintained at a pressure as low as $10^{-6}$ Pa allows it to operate effectively.

Further, with the differential evacuation structure adopted that holds the region in the first casing 21 much lower in pressure than the region of the specimen 18 via the second casing, it becomes possible to place the region of the specimen 18 enough under a pressure as high as several tens Pa, thus providing ease for handling the specimen 18.

Further, the electron beam B coming out of the objective lens stop or diaphragm 13 is made precisely in alignment with the system axis by the axial alignment electrode assembly 14 and is therefore made possible to assume its precise irradiating position with respect to the specimen 18.

Also, the electron beam B coming out of the final lens stop or diaphragm 15 and then deformed by the astigmatic correction electrode assembly 16 so as to have a circular projected image when incident on a surface of the specimen 18 increases the resolution and improves the accuracy of its detecting a thin film structure on the specimen 18.

Further, scanning the thin film structure on the specimen 18 with the electron beam B coming out of the final lens stop or diaphragm 15 and scan-deflected by the scan deflection electrode assembly 17 causes the surface of the screen 19 to be scanned or traversed with the reflected electron beams from the specimen 18 successively in the directions of the x-axis and the y-axis in synchronous with a scan action by the imager 20a in the detector means 20. Thus, using detected signals as z-signals that correspond to x-y positions allows the thin film structure on the specimen 18 to be displayed in a magnified image on the display 20b in the detector means 20.

Finally, locating the screen 19 on which the reflected electrons from the specimen 18 are incident and impinge, away from the specimen 18 at a distance as short as 50 mm or less, allows the region of the specimen 18 to be placed under a pressure as high as several tens Pa without causing the reflected electrons from the specimen 18 much to collide with gaseous molecules and scatter on the way, thus permitting them to be incident on the screen 19 for detection without fail.

It should be noted here that the screen 19 may advantageously be constituted by a porous screen with electron multiplying functions (so-called multi-channel plate screen).

Such a screen permits the incident and impinging reflected electron beams and hence the diffraction signal if weak to be detected without fail by virtue of its electron multiplying functions, and thus serves to enhance the sensitivity of the electron diffraction system.

An explanation is next given in respect of a second embodiment of the present invention with reference to FIGS. 8 to 13.

While in the first embodiment the scan deflection electrode assembly is made of two pairs of electrodes or electromagnetic coils disposed crossways, in the second embodiment additional use is made of two additional pairs of electrodes or electromagnetic coils disposed crossways. The explanation that follows of the second form of embodiment assumes using electromagnetic coils.

Figure 8:
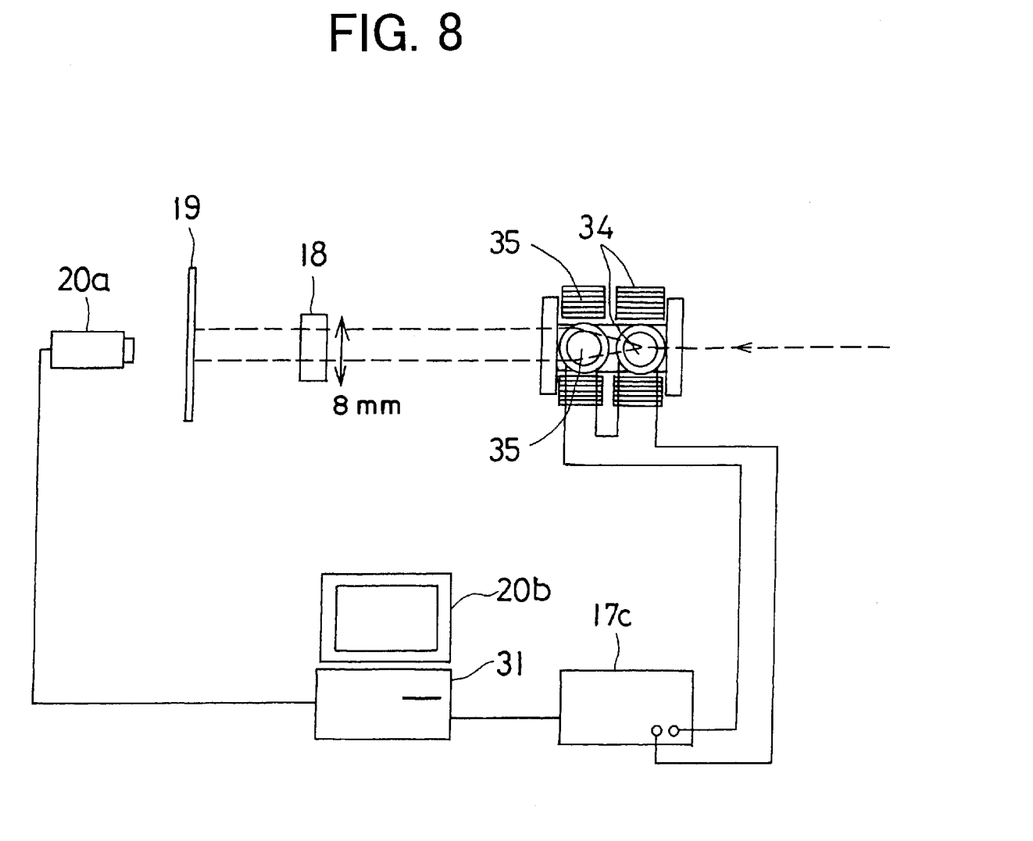
FIG. 8 is a diagrammatic view illustrating a high-energy electron diffraction apparatus in use that represents a second form of embodiment of the present invention with an electron beam and a specimen as viewed from top.

FIG. 8 is a diagrammatic view that illustrates a scan deflection means in use and shows an electron beam and a specimen as seen from the top.

Referring to FIG. 8, the second embodiment includes a first group of deflecting electromagnetic coils 34 and 34 comprising two pairs of electromagnetic coils of different polarities for deflecting the electron beam coming out of the astigmatic correction means in the directions of the x- and y-axis, and a second group of electromagnetic coils 35 and 35 comprising two pairs of electromagnetic coils of different polarities for deflecting the thus deflected electron beam to arbitrarily adjust its angle of direction, especially to cause it to travel parallel to a given direction that is defined by a given angle of incidence on the specimen 18 and that is also perpendicular to a direction in which the specimen 18 is scanned therewith. Thus, the specimen 18 is designed for scanning with a traverse or sweep of the electron beam being incident thereon with the given angle of incidence, the traverse causing the mirror reflected electron beams from the specimen 18 to strike on the screen 19 and their intensities to be detected by the imager 20a that comprises, e.g., a CCD.

In this case, a computer 31 is included for performing parallel-processing of RHEED patterns rapidly using a combination of the CCD and an image processor, and to hold mutual relations between electron beam parameters control led and beam irradiated areas of the specimen selected, and intensities detected of mirror reflected electron beams from those irradiated areas under centralized management and control.

Further, the computer 31 is used to control deflections of the electron beam by acting on the first and second sets of electromagnetic coils 34 and 34; and 35 and 35 via their drive control 17.

An explanation is next given with respect to operations of the second embodiment of the invention.

FIG. 9A is a view illustrating a path of travel of an electron beam in the second form of embodiment of the invention, as seen from a side and FIG. 9B is a view illustrating the path of travel of the electron beam as viewed from the bottom.

Figure 9:
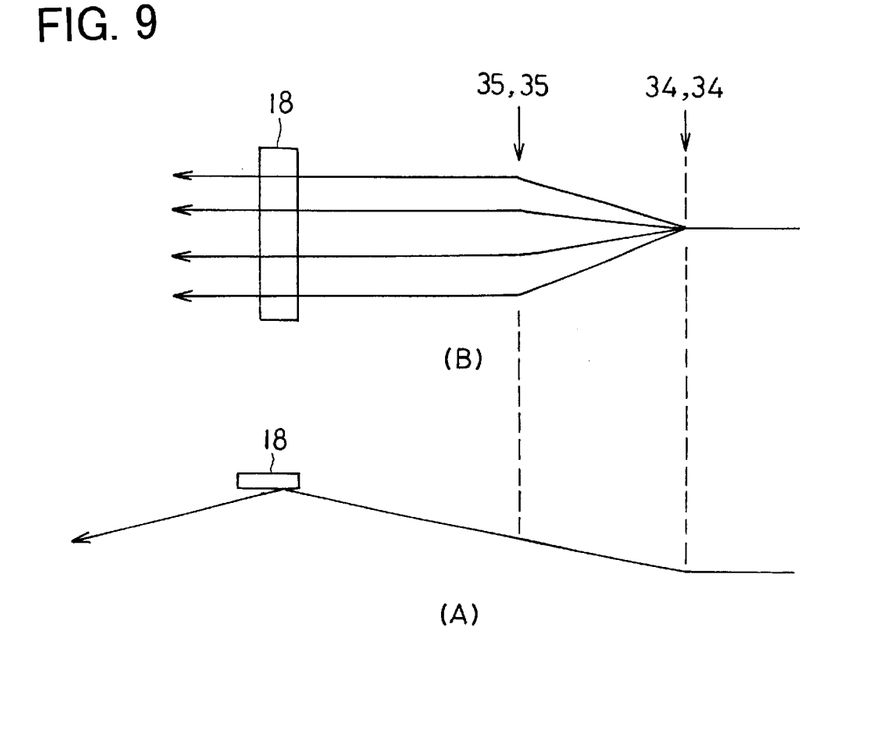
FIG. 9A is a diagrammatic view illustrating a path of travel of an electron beam in the second form of embodiment of the present invention, as viewed from a side.
FIG. 9B is a diagrammatic view illustrating paths of the electron beam as viewed from bottom.

Referring to FIG. 9, the first set of electromagnetic coils is used to deflect the electron beam arriving from the electron gun 12 to cause it to extend over in a plane inclined to a vertical plane of the incident electron beam with a given angle and then to cause it to be incident into the second set of electromagnetic coils. The extended electron beam is then made to be parallel and also deflected with an angle defined by an angle of incidence on the specimen 18 to be irradiated therewith.

Consequently, the present embodiment of the invention allows a specimen 18 to be scanned with an expanded parallel electron beam and a given area of the surface of the specimen to be aimed and scanned with the electron beam as such and incident thereon with any desired angle of incidence as adjusted.

An explanation is next given with respect to a method of taking a rocking curve for diffraction.

Figure 10:
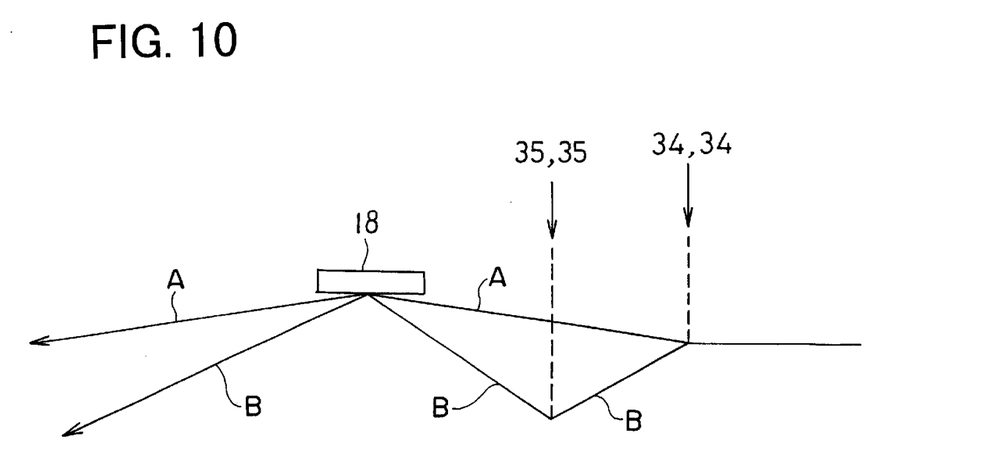
FIG. 10 is a diagrammatic view illustrating an action performed to cause an electron beam to travel assuming a rocking curve in the second form of embodiment of the present invention.

FIG. 10 is a diagrammatic view illustrating an action performed to cause an electron beam to travel assuming a rocking curve in the second embodiment of the invention.

Referring to FIG. 10, should the electron beam A be incident with a given small angle on the specimen, the electron beam A may be adjustably deflected by a predetermined angle by the first set of electromagnetic coils 34 and 34 and then incident into the second set of electromagnetic coils 35 and 35 in which it may be or remain deflected with such a preselected angle that it may be incident on the specimen with that given small angle. In the present embodiment it should be noted that the specimen 18 is left immovable.

Should the electron beam B be incident on the specimen with a large given angle, the electron beam is deflected by the first set of electromagnetic coils 34 and 34 with a predetermined angle as bent downwards to be incident into the second set of electromagnetic coils 35 and 35 by which it is deflected with a preselected angle as bent upwards to be incident on the specimen with that given large angle. It should be noted that a desired area on the specimen can be scanned with the expanded parallel electron beam as mentioned in connection with FIG. 9.

Thus, in the present embodiment, electrical control for the first and second sets of electromagnetic coils 34 and 34, and 35 and 35 alone permits any area desired on the specimen 18 to be scanned with the electron beam incident with any angle of incidence as desired.

The present invention in this embodiment requires no mechanical drive means for scanning and, therefore, permits a rocking curve as required for rapid diffraction analysis to be obtained promptly.

Now then, while in FIG. 8 the first and second deflection coil assemblies are both illustrated as constituting a scan deflection means, it is possible to use the first deflection coil assembly as an astigmatic correction means and the second deflection coil assembly as a scan deflection means. In this case, the first deflection coil assembly has a pair of electromagnetic coils of a same polarity disposed crossways.

If an electrode or coil assemblies producing electromagnetic forces are used as an astigmatic correction means and a scan deflection means, a pair of electrodes or electromagnetic coils may have a same polarity if used to form the astigmatic correction means and may have different polarities if used to form the scan deflection means.

And, if they are used to act in directions of x-axis and y-axis, two pairs may be provided simply with each pair for each of the two directions, respectively.

Further, in view of the fact that the astigmatic correction means may be distributed not simply in four directional positions but in eight directional positions, it is seen possible to distribute the astigmatic correction means in four directional positions and the scan deflection means in the other four directional positions.

It is thus seen that distributing the astigmatic correction means and the scan deflection means at positions symmetrical about the system axis of a high-energy electron diffraction system makes it possible both to reduce the diameter of an electron beam and to deflect it.

An explanation is next given with respect to operations of a process of combinatorial laser molecular beam epitaxy having applied thereto a high-energy electron diffraction analysis apparatus according to the present invention.

The combinatorial laser molecular beam epitaxy process is designed to gasify solid materials by irradiating targets of the materials with laser beam light and to mask and unmask with a movable mask, regions on a specimen for the gasified material, thereby causing thin films of the different materials to epitaxially grow and be formed as individual monomolecular layers on a surface area of the specimen.

Figure 11:
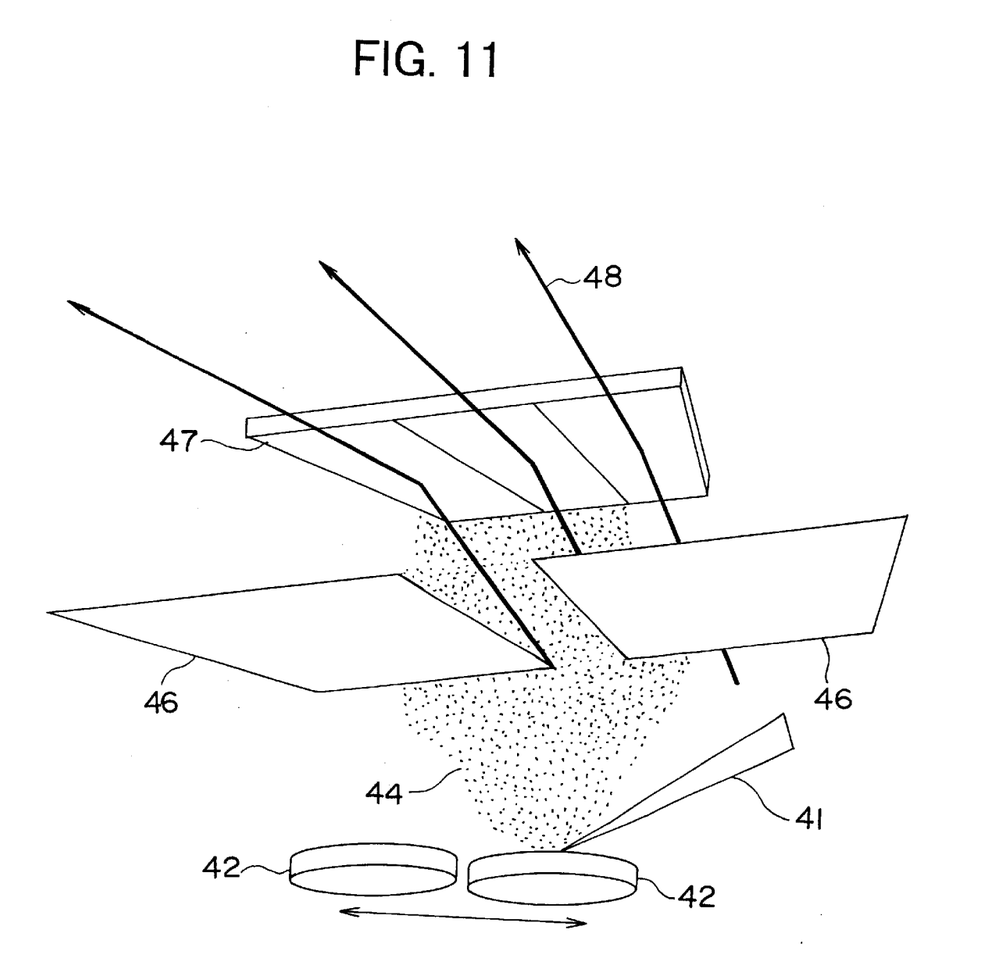
FIG. 11 is a diagrammatic view illustrating the forming of a thin film in a combinatorial laser molecular beam epitaxy process using the second form of embodiment of the present invention.
Figure 12:
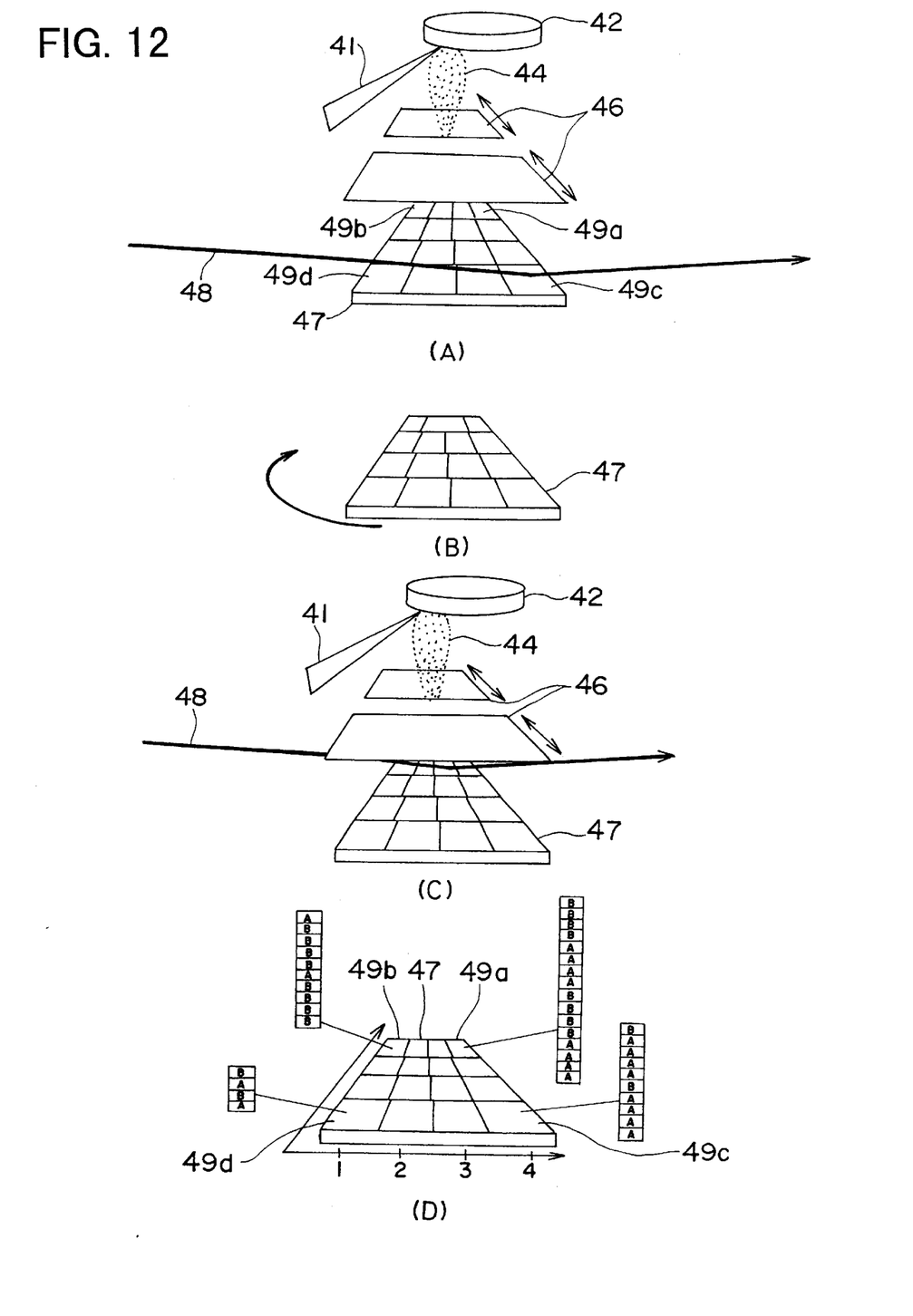
FIGS. 12A, 12B, 12C and 12D are diagrammatic views that illustrate an example of the synthesis of a super lattice by a combinatorial laser molecular beam epitaxial process using the second form of embodiment of the present invention.

FIG. 11 is a diagrammatic view illustrating essential portions of the forming of thin films by the combinatorial laser molecular beam epitaxy process. It should be noted that means for heating the specimen and so forth are omitted from illustration.

Referring to FIG. 11, the combinatorial laser molecular beam epitaxy process is shown using a KrF excimer laser 41 to irradiate a target 42 therewith to produce a precursor 44, and moving movable masks 46 and 46 to mask and unmask therewith, selected regions of a specimen 47 with respect to the precursor 44, thereby to cause a thin film of layers that vary in combination of elements or thin films that vary in sequence of such layers to build up on an area or areas on the specimen 47. During this process, the epitaxial growth of each individual monomolecular layer that is in a process of its buildup is monitored by scanning the area or each of the areas with an electron beam 48 moving in parallel jointly with the movements of the movable masks 46.

The movable masks may be masks formed with different masking patterns and it is then simply required that the system be provided with a mechanism that is capable of exchanging different masks in sequence.

Thus, exchanging masking patterns with a movable mask for given areas of the specimen permits forming by epitaxial growth for each individual monomolecular layer, a thin film of layers that vary in combination of elements or thin films that vary in sequence of such layers to build up on an area or areas on the specimen as well.

Causing a parallel expanded electron beam 48 of 10 to 50 keV from a high-energy electron diffraction apparatus according to the present invention to be incident on a surface of the specimen at an angle as small as 1 to 2 degrees produces RHEED intensity oscillations with a period corresponding to each individual atomic or molecular layer. The angle of incidence of the electron beam onto the specimen surface may be set up by the first defection coil assembly 34, 34, and this deflected electron beam that otherwise spreads or swings may be rectified in angle to move parallel to allow the aimed area of the specimen to be swept thereby.

FIGS. 12A, 12B, 12C and 12D are diagrammatic views that show an example of the synthesis of a super lattice by the combinatorial laser molecular beam epitaxial process wherein the same reference characters as in FIG. 11 are used to designate the same parts and the arrangement is top and bottom reversed.

As shown in FIG. 12A, as the movable masks 46 and 46 are moved, a material A is built up on preselected areas of the specimen, e.g., those designated by reference characters 49a, 49b, 49c and 49d, while the epitaxial growth of each individual monomolecular layer is being monitored by a high-energy electron diffraction analysis apparatus according to the present invention. Then, these areas differ in the molecular layer that a material A epitaxially grows according to the masking sequence.

The angle of incidence of the electron beam onto each of the areas of the specimen surface may be set up by the first defection coil assembly 34, 34, and this deflected electron beam that otherwise spreads or swings may be rectified in angle by the second deflection coil assembly 35, 35 to move parallel to allow the aimed area of the specimen to be scanned thereby. On that area having had an epitaxial growth, the electron beam is moved jointly with the movable masks to scan a next area therewith.

Respective electron diffraction patterns for the growth areas on the specimen are fetched or drawn in time sequence by the CCD shown in FIG. 8 to derive the images which are bundled for respective pixels, and systematic changes in the images of the pixels are bundled independently and parallel and displayed on the display 20b (FIG. 8).

Next, as shown in FIG. 12B, the specimen 47 is rotated by 90 degrees to allow a material B to build up to form a preselected number of pixels for each of the areas as shown in FIG. 12C.

Thus, as shown in FIG. 12D according to the masking sequence, for example, the materials A and B are formed each for four consecutive molecular layers in the area 49a, the materials A and B are formed alternately in four molecular layers in the area 49b, one molecular layer of the material B and four molecular layers of the material A are formed alternately in the area 49c and one layer of the material A and one layer of the material B are formed alternately in the area 49d.

Figure 13:
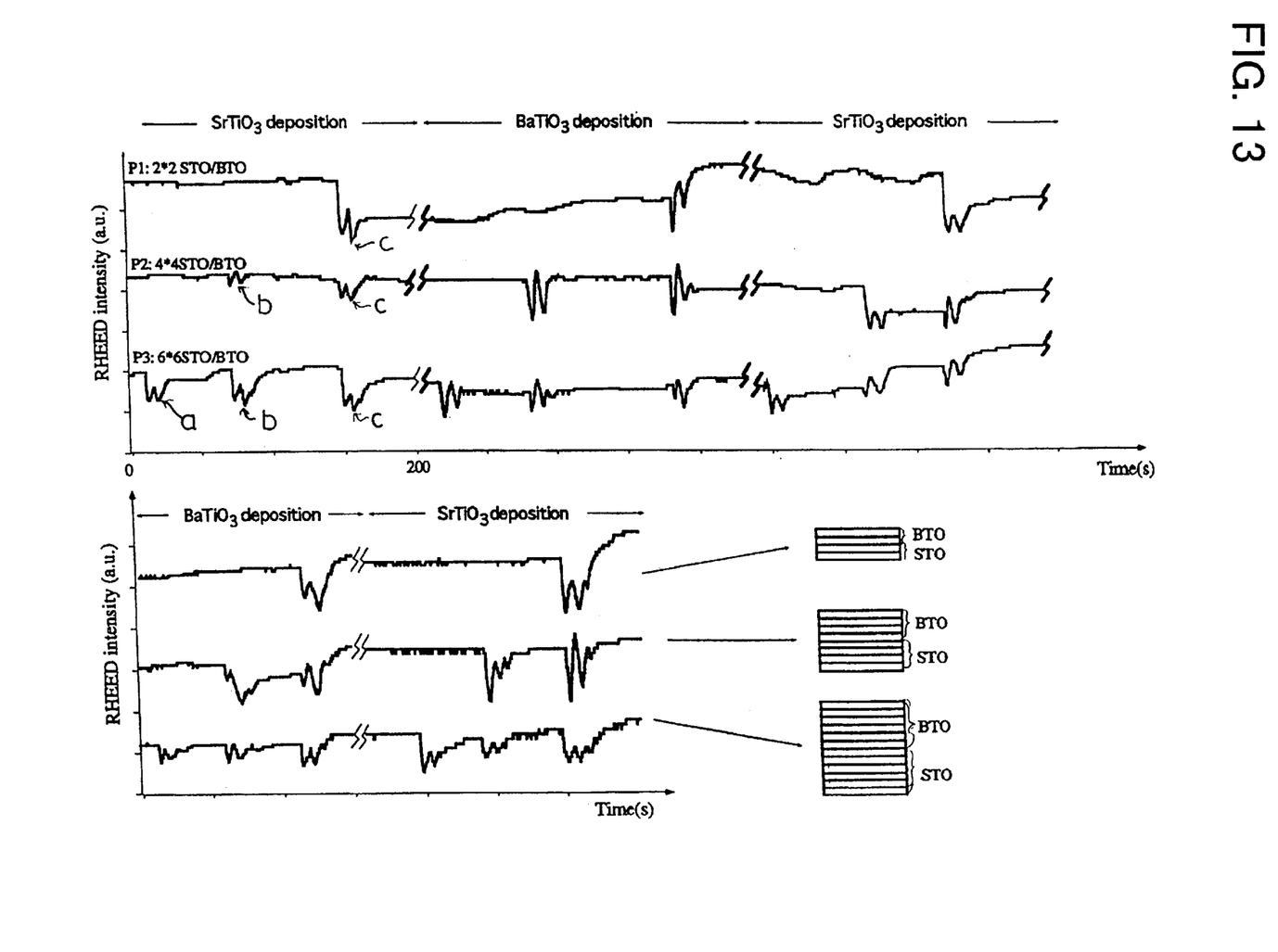
FIG. 13 is a view of RHEED oscillations in the second form of embodiment of the present invention.

FIG. 13 is a view of RHEED oscillations as observed in a high-energy electron diffraction analysis apparatus according to the present invention.

In FIG. 13, a shows that pixel 1 (indicated by P1) and pixel 2 (indicated by P2) are masked by the movable masks and only pixel 3 (indicated by P3) has an epitaxial growth.

And, b shows that only the pixel 1 (P1) is masked by the movable masks and the pixels 2 and 3 (P2 and P3) have each an epitaxial growth. Further, c shows that the pixels 1, 2 and 3 (P1, P2 and P3) are unmasked and each have an epitaxial growth.

Thus, specifically, the RHEED oscillations are shown that are as observed when the pixel 1 (P1) had epitaxial growth of $SrTiO_3$ and $BaTiO_3$ each in two molecular layers, the pixel 2 (P2) had epitaxial growth of $SrTiO_3$ and $BaTiO_3$ each in four molecular layers, and the pixel 3 (P3) had epitaxial growth of $SrTiO_3$ and $BaTiO_3$ each in six molecular layers.

It is thus seen that a high-energy electron diffraction apparatus according to the present invention enables a specimen to be scanned with an electron beam while directions of its incidence are held parallel directed at given points on the specimen.

Further, a high-energy electron diffraction apparatus of the present invention enables the angle of incidence of an electron beam at a given point on a specimen to be arbitrarily set, and thus the electron beam to be incident at a given point on the specimen with any angle of incidence desired.

Also, a high-energy electron diffraction apparatus of the present invention permits RHEED patterns at different points to be rapidly gathered and parallel processed using a CCD and a image processor combined and operated synchronously with scan operations with an electron beam and thus provides the ability to simultaneously analyze changes with time of RHEED images and intensities at different points.

As will be apparent from the foregoing description, designing an electron beam source in accordance with the present invention to include a field emission type emitter reduces the beam diameter of an electron beam incident on a specimen to 0.5 $\mu$m or less if the specimen is spaced apart from the electronic optical objective lens at a distance as long as 150 to 300 mm.

It follows therefore that if the electron beam is incident on the specimen at an angle of, say, 3 degrees, the beam as projected on the specimen has a size as small as 100 $\mu$m×0.5 $\mu$m which is well capable of identifying a thin film structure of a size of 100 $\mu$m×100 $\mu$m or less such as a pixel of a size of 100 $\mu$m×100 $\mu$m or less as involved in combinatorial synthesis techniques.

Further, the construction that makes up the region from the electron beam source constituted with a field emission type electron emitter to the specimen in a two-stage differential evacuator structures partitioned by a objective diaphragm and a final diaphragm allows the region of the electron beam source to the objective diaphragm to be held under a low pressure of $10^{-6}$ Pa or less well-suited for the field emission type electron emitter and yet a region of the specimen to be held under a comparatively high pressure of several tens Pa. Thus, should the source region be evacuated to a high vacuum as low as $10^{-6}$ Pa or less which the use of a field emission type electron emitter as the electron beam source requires, creating a difference in pressure in two stages allows not only the first region to be readily so evacuated but a region of the specimen to be left high in pressure for the ease of handling specimens.

There is thus provided in accordance with the present invention a high-energy electron diffraction apparatus that is extremely useful as a high-performance reflex type high-energy electron diffraction analysis apparatus, especially because its afforded ability to monitor and identify a thin film structure of a size of 100 $\mu$m×100 $\mu$m being synthesized in parallel.

Hereinafter, the present invention will be described in detail with reference to various embodiments thereof illustrated in the drawing figures. While the present invention will hereinafter been set forth with respect to certain illustrative embodiments thereof, it will readily be appreciated to be obvious to a person skilled in the art that many alterations thereof, omissions therefrom and additions thereto can be made without departing from the scope of the present invention. Accordingly, it should be understood that the invention is not intended to be limited to the specific embodiments thereof set forth below, but to include all possible embodiments thereof that can be made within the scope with respect to the features specifically set forth in the appended claims and encompasses all the equivalents thereof.

What is claimed is:

1. A high-energy electron diffraction apparatus of a reflection type that is capable of monitoring and identifying varying thin film structures of 100 $\mu$m×100 $\mu$m or less in size being synthesized in parallel with one another on a specimen in a high pressure of several tens Pa, in which a specimen is held in a vacuum chamber capable of evacuation to a high vacuum and is irradiated with a high-energy beam of electrons to form an image of reflected beam diffraction, the apparatus comprising:

a first casing adapted to accommodate therein an electron beam source for producing an electron beam, the first casing having a first aperture; and a second casing coupled to said first casing via said first aperture and having an end portion formed with a second aperture coaxial with said first aperture, wherein said first and second casings form a differential evacuation structure with said first casing held lower in pressure than said second casing, and wherein said electron beam source accommodated in said first casing comprises:

a field emission type electron emitter;

an astigmatic correction means for correcting a projected image of said electron beam incident on said specimen; and a scan deflection means for adjustably positioning said electron beam relative to an area on said specimen that is irradiated therewith; and a movable screen for projecting thereon diffracted electron beams from said specimen.

2. A high-energy electron diffraction apparatus as set forth in claim 1 in which said first casing is provided in a region of said first aperture with an electronic objective lens and objective diaphragm or lens stop for focusing the electron beam from said source on a specimen, and said second casing is provided at said second aperture with a final diaphragm or lens stop.

3. A high-energy electron diffraction apparatus as set forth in claim 1 or claim 2 in which between the objective diaphragm or lens stop disposed in the region of said first aperture in said first casing and the final diaphragm or lens stop disposed at said second aperture in said second casing there is disposed an axial alignment means for adjusting an axial alignment of the electron beam passed through said objective diaphragm or lens stop.

4. A high-energy electron diffraction apparatus as set forth in claim 1 or claim 2 in which said astigmatic correction means and said scan deflection means are disposed between said final diaphragm or lens stop disposed at said second aperture and said specimen.

5. A high-energy electron diffraction apparatus as set forth in claim 4 in which said astigmatic correction means and said scan deflection means are disposed alternately in a same plane perpendicular to and symmetrically about an axis of said electron beam.

6. A high-energy electron diffraction apparatus as set forth in claim 4 in which said astigmatic correction means and said scan deflection means are constructed so as to be interchangeable on changing polarity.

7. A high-energy electron diffraction apparatus as set forth in claim 4 in which each of said astigmatic correction means and said scan deflecting means includes a plurality of pairs of electrodes or electromagnetic coils.

8. A high-energy electron diffraction apparatus as set forth in claim 4 in which said scan deflection means includes a first and a second deflecting electromagnetic coil means for permitting the electron beam to be incident on said specimen at any given angle of incidence as desired.

9. A high-energy electron diffraction apparatus as set forth in claim 1 or claim 2, in which said movable screen is disposed at a position close to said specimen.

10. A high-energy electron deflection apparatus as set forth in claim or claim 2 in which said screen is disposed at a position spaced apart from said specimen at a distance not greater than 50 mm.

11. A high-energy diffraction apparatus as set forth in claim 1 or claim 2 in which a screen for projecting thereon the diffracted electron beams from said specimen comprises a porous screen with an electron multiplying function.

* * * * *